United States Patent
Ahn et al.

(10) Patent No.: US 10,622,231 B2
(45) Date of Patent: Apr. 14, 2020

(54) METHOD OF MANUFACTURING SEMICONDUCTOR PACKAGE

(71) Applicant: Samsung Electronics Co., Ltd., Suwon-si (KR)

(72) Inventors: Jin-chan Ahn, Hwaseong-si (KR); Won-young Kim, Seoul (KR); Kyung-seon Hwang, Incheon (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 28 days.

(21) Appl. No.: 16/140,877

(22) Filed: Sep. 25, 2018

(65) Prior Publication Data
US 2019/0115235 A1 Apr. 18, 2019

(30) Foreign Application Priority Data
Oct. 18, 2017 (KR) .................. 10-2017-0135231

(51) Int. Cl.
*H01L 21/67* (2006.01)
*G01R 31/00* (2006.01)
(Continued)

(52) U.S. Cl.
CPC ........ *H01L 21/67271* (2013.01); *G01R 31/00* (2013.01); *G01R 31/31718* (2013.01); *H01L 21/565* (2013.01); *H01L 21/67282* (2013.01); *H01L 21/78* (2013.01); *H01L 22/14* (2013.01); *H01L 22/20* (2013.01); *H01L 23/544* (2013.01); *H01L 24/97* (2013.01); *H01L 25/0657* (2013.01); *H01L 25/50* (2013.01);
(Continued)

(58) Field of Classification Search
None
See application file for complete search history.

(56) References Cited

U.S. PATENT DOCUMENTS 6,392,427 B1 * 5/2002 Yang .................. G11C 29/56
324/750.16
6,483,334 B1 * 11/2002 Hsieh ................ G01R 31/2855
257/E21.525
(Continued)

FOREIGN PATENT DOCUMENTS

JP 6-84730 3/1994
JP 6-216265 8/1994
(Continued)

*Primary Examiner* — Andres Munoz
(74) *Attorney, Agent, or Firm* — Muir Patent Law, PLLC

(57) ABSTRACT

A method of manufacturing a semiconductor package includes obtaining a plurality of individual chips classified according to a test bin item as a result of performing an electrical die sorting (EDS) process including testing electrical characteristics of a plurality of chips at a wafer level, packaging the individual chips on corresponding chip mounting regions of a circuit substrate and forming a plurality of individual packages based on position information of the chip mounting regions, each of the individual packages having test bin item information corresponding to the test bin item, classifying the plurality of individual packages according to the test bin item based on the test bin item information, and testing the individual packages classified according to the test bin item.

20 Claims, 21 Drawing Sheets

(51) Int. Cl.
*H01L 21/66* (2006.01)
*G01R 31/317* (2006.01)
*H01L 21/56* (2006.01)
*H01L 21/78* (2006.01)
*H01L 23/544* (2006.01)
*H01L 23/00* (2006.01)
*H01L 25/065* (2006.01)
*H01L 25/00* (2006.01)
*G01R 31/28* (2006.01)
*H01L 23/31* (2006.01)

(52) U.S. Cl.
CPC ........ *G01R 31/2896* (2013.01); *H01L 21/561* (2013.01); *H01L 23/3128* (2013.01); *H01L 24/16* (2013.01); *H01L 2223/54433* (2013.01); *H01L 2224/16225* (2013.01); *H01L 2224/16227* (2013.01); *H01L 2224/32145* (2013.01); *H01L 2224/97* (2013.01); *H01L 2225/06517* (2013.01); *H01L 2225/06565* (2013.01); *H01L 2225/06586* (2013.01); *H01L 2924/15311* (2013.01)

(56) References Cited

U.S. PATENT DOCUMENTS

| | | | |
|---|---|---|---|
| 7,031,791 B1* | 4/2006 | Chang | H01L 21/67276 |
| | | | 324/759.03 |
| 7,832,648 B2 | 11/2010 | Kudo | |
| 9,287,142 B2 | 3/2016 | Yokosawa | |
| 2003/0139839 A1* | 7/2003 | Beffa | G01R 31/2894 |
| | | | 700/115 |
| 2006/0088981 A1 | 4/2006 | Chen et al. | |

FOREIGN PATENT DOCUMENTS

| | | |
|---|---|---|
| JP | 7-36997 | 2/1995 |
| KR | 10-1060907 | 8/2011 |

* cited by examiner

METHOD OF MANUFACTURING SEMICONDUCTOR PACKAGE

CROSS-REFERENCE TO RELATED APPLICATION

This application claims the benefit of Korean Patent Application No. 10-2017-0135231, filed on Oct. 18, 2017, in the Korean Intellectual Property Office, the disclosure of which is incorporated herein in its entirety by reference.

BACKGROUND

The present disclosure relates to a method of manufacturing a semiconductor device, and more particularly, to a method of manufacturing a semiconductor package, which includes a wafer process, a package process (or an assembly process), and a test process.

A method of manufacturing a semiconductor package may include a wafer process of manufacturing a chip on a wafer, a packaging process (or assembly process) of individually packaging the chip manufactured on the wafer to form a package, and a test process of testing the chip manufactured on the wafer or testing package. In the method of manufacturing the semiconductor package, each of the processes should be simplified without sacrificing desired reliability.

SUMMARY

The inventive concept provides a method of manufacturing a semiconductor package, which can simplify a packaging process or a test process and/or increase reliability.

According to an aspect of the inventive concept, there is provided a method of manufacturing a semiconductor package. The method includes obtaining a plurality of individual chips classified according to a test bin item as a result of performing an electrical die sorting (EDS) process including testing electrical characteristics of a plurality of chips at a wafer level, packaging the individual chips on corresponding chip mounting regions of a circuit substrate and forming a plurality of individual packages based on position information of the chip mounting regions, each of the individual packages having test bin item information corresponding to the test bin item, classifying the plurality of individual packages based on the test bin item based on the test bin item information, and testing the individual packages classified according to test bin item.

According to another aspect of the inventive concept, there is provided a method of manufacturing a semiconductor package. The method includes performing an EDS process for testing electrical characteristics of a plurality of chips on a wafer level, sawing the wafer to obtain a plurality of individual chips, which are classified according to a test bin item through the EDS process, attaching the individual chips to a plurality of chip mounting regions of a circuit substrate, respectively, forming a strip package including a molding layer obtained by molding the individual chips attached to the circuit substrate, marking test bin item information corresponding to the test bin item on a surface of the molding layer of the individual chips based on position information of the chip mounting regions, sawing the strip package by the individual chips and forming a plurality of individual packages, classifying the individual packages according to the test bin item by using the test bin item information, and testing the individual packages classified according to the test bin item.

According to another aspect of the inventive concept, there is provided a method of manufacturing a semiconductor package. The method includes testing electrical characteristics of a plurality of chips on a wafer level by using a wafer tester and obtaining a plurality of individual chips, which are classified according to test bin item, attaching the individual chips to a plurality of chip mounting regions of a circuit substrate, respectively by using a chip attacher, forming a strip package including a molding layer obtained by molding the individual chips on the circuit substrate with a molder, marking test bin item information corresponding to the test bin item on a surface of the molding layer of each of the individual chips with a marker based on position information of the chip mounting regions, sawing the strip package by the individual chips by using a package sorter and forming a plurality of individual packages, classifying the individual packages according to the test bin item by using the package sorter and mounting the classified individual packages on a test tray, and testing the individual packages, which are classified according to the test bin item, by using a package tester.

BRIEF DESCRIPTION OF THE DRAWINGS

Embodiments of the inventive concept will be more clearly understood from the following detailed description taken in conjunction with the accompanying drawings in which.

DETAILED DESCRIPTION

A process (or method) of manufacturing a semiconductor device may be largely divided into a wafer process, which is a front-end process, and a packaging (or assembly) process, which is a back-end process. The wafer process may be a process of forming a plurality of chips having an integrated circuit (IC) on a wafer. Each of the plurality of chips may be a memory chip or a logic chip. The memory chip may be a chip included in dynamic random access memory (DRAM), mobile DRAM, static RAM (SRAM), phase-change RAM (PRAM), ferroelectric RAM (FRAM), resistive RAM (RRAM), or magnetic RAM (MRAM).

The packaging process may be a process of forming individual packages by mounting the chips on a circuit substrate and protecting the chips mounted on the circuit substrate with a molding layer. Although the following embodiments describe some examples of the individual packages, the individual packages may be packages, such as Package on Packages (PoPs), ball grid arrays (BGAs), chip-scale packages (CSPs), plastic-leaded chip carriers (PLCCs), plastic dual in-line packages (PDIPs), die-in-waffle-packs, die-in-wafer forms, chip-on-boards (COBs), ceramic dual in-line packages (CERDIPs), plastic metric quad flat-packs (MQFPs), thin quad flat-packs (TQFPs), small outlines (SOICs), shrink small outline packages (SSOPs), thin small outlines (TSOPs), thin quad flatpacks (TQFPs), system-in-packages (SIPs), multi-chip packages (MCPs), wafer-level fabricated packages (WFPs), or wafer-level processed stack packages (WSPs).

The process (or method) of manufacturing the semiconductor device may include a test process of testing the chips or the individual packages manufactured on the wafer. The method of manufacturing the semiconductor device will be described in detail based on the above descriptions.

Figure 1:
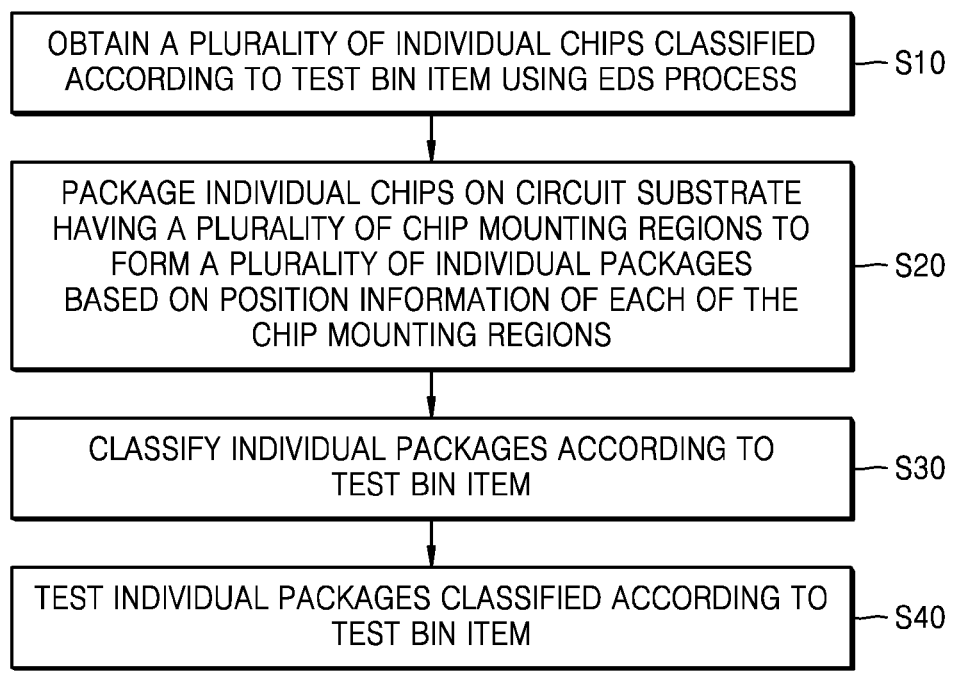
FIG. 1 is a flowchart of a method of manufacturing a semiconductor device according to example embodiments.
Figure 2:
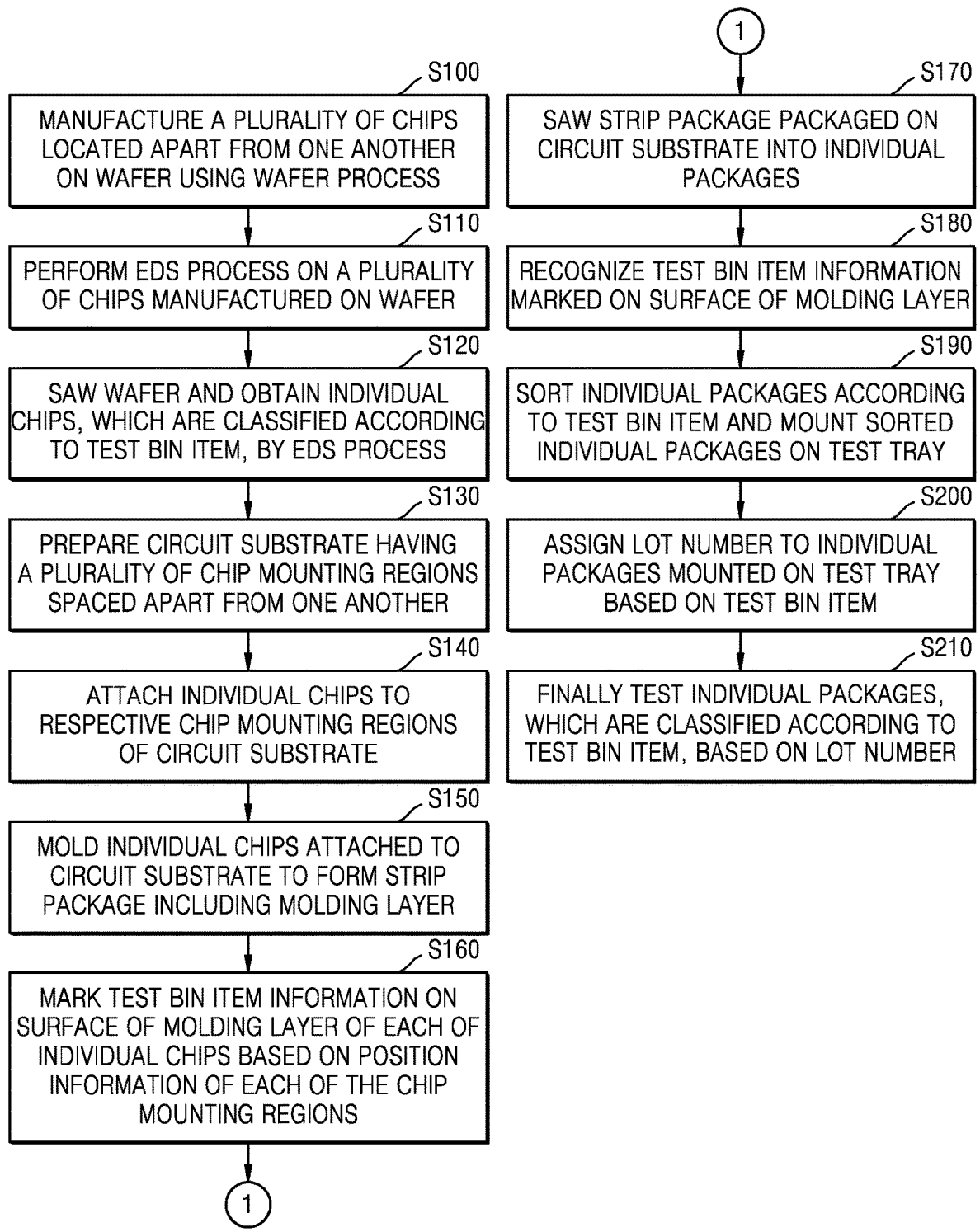
FIG. 2 is a detailed flowchart of the method of manufacturing the semiconductor device of FIG. 1 according to example embodiments.

FIG. 1 is a flowchart of a method 10 of manufacturing a semiconductor device according to example embodiments, and FIG. 2 is a detailed flowchart of the method of FIG. 1 according to example embodiments.

Specifically, as shown in FIG. 1, the method 10 of manufacturing a semiconductor device may include an operation (or step) S10 of obtaining a plurality of individual chips, which are classified or divided according to a test bin item, by using an electrical die sorting (EDS) process, an operation S20 of forming a plurality of individual packages by packaging the individual chips, such as on a circuit substrate having a plurality of chip mounting regions based on position information (e.g., X, Y coordinates) of the chip mounting regions, to form individual packages, by using a package process (or an assembly process), an operation S30 of classifying the individual packages according to the test bin item (e.g., by a package sorter as described below), and an operation S40 of testing the individual packages classified according to the test bin item (e.g., by the package sorter as described below).

As shown in FIG. 2, operation S10 of obtaining the individual chips may include an operation S100 of manufacturing a plurality of chips spaced apart from one another on a wafer, by using conventional semiconductor chip manufacturing processes, an operation S110 of performing the EDS process on the plurality of chips manufactured on the wafer, and an operation S120 of sawing the wafer and obtaining the individual chips, which are classified according to a test bin item, by using the EDS process. Steps S100, S110 and S120 may be repeatedly formed to classify individual chips that are sawn from different wafers so that subsequent packaging steps described herein may be performed with individual chips formed from and sawn from different wafers. The EDS process and the classification according to test bin item will be described in detail below.

As shown in FIG. 2, operation S20 of forming the individual packages may include an operation S130 of preparing a circuit substrate having a plurality of chip mounting regions spaced apart from one another, an operation S140 of attaching the individual chips (which may be formed from and sawn from different wafers) to respective chip mounting regions of the circuit substrate, and an operation S150 of forming a package, such as a strip package including a molding layer obtained by molding the individual chips attached to the chip mounting regions of the circuit substrate.

In operation S140 of attaching the individual chips to the respective chip mounting regions of the circuit substrate, one individual chip or a plurality of individual chips (e.g., two or more stacked individual chips) may be attached to each of the chip mounting regions of the circuit substrate. Operation S140 of attaching the individual chips to the respective chip mounting regions of the circuit substrate may be performed by using a chip attacher as described below.

Operation S150 of molding the individual chips attached to the chip mounting regions of the circuit substrate may be performed by using a molder (or a molding device) as described below.

Furthermore, as shown in FIG. 2, operation S20 of forming the individual packages may include an operation S160 of marking test bin item information on a surface of the molding layer formed over the individual chips based on position information (e.g., X, Y coordinates) of each of the chip mounting regions of the circuit substrate and an operation S170 of sawing the strip package by the individual chips into individual packages. When marking the test bin item information, for example, two-dimensional barcode may be used.

Operation S160 of marking the test bin item information on the surface of the molding layer packaging the individual chips may be performed by a marker as described below. Operation S170 of sawing the strip package by the individual chips into the individual packages may be performed by a package sorter as described below.

As shown in FIG. 2, operation S30 of classifying the individual packages according to the test bin item may include an operation S180 of recognizing the test bin item information marked on the surface of the molding layer formed on each of the individual chips, an operation S190 of sorting the individual packages according to a test bin item based on the recognized test bin item information and mounting the sorted individual packages on a test tray, and an operation S200 of assigning a lot number to the individual packages mounted on the test tray, based on test bin item.

As shown in FIG. 2, operation S40 of testing the individual packages classified according to the test bin item may include an operation S210 of testing the individual packages according to a test bin item based on the lot number. In operation S210, testing of the classified individual packages may include testing for electrical characteristics of the individual packages other than for the test bin item.

Figure 3:
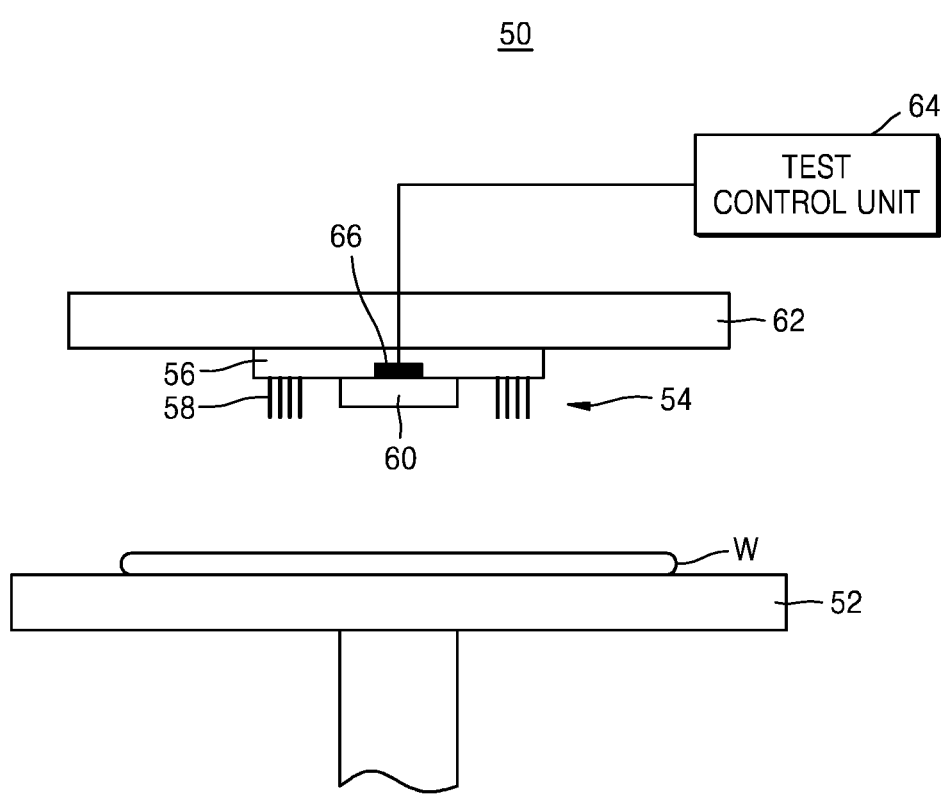
FIGS. 3 to 5 are diagrams of an operation or process of obtaining individual chips in the method of manufacturing the semiconductor device of FIGS. 1 and 2.
Figure 4:
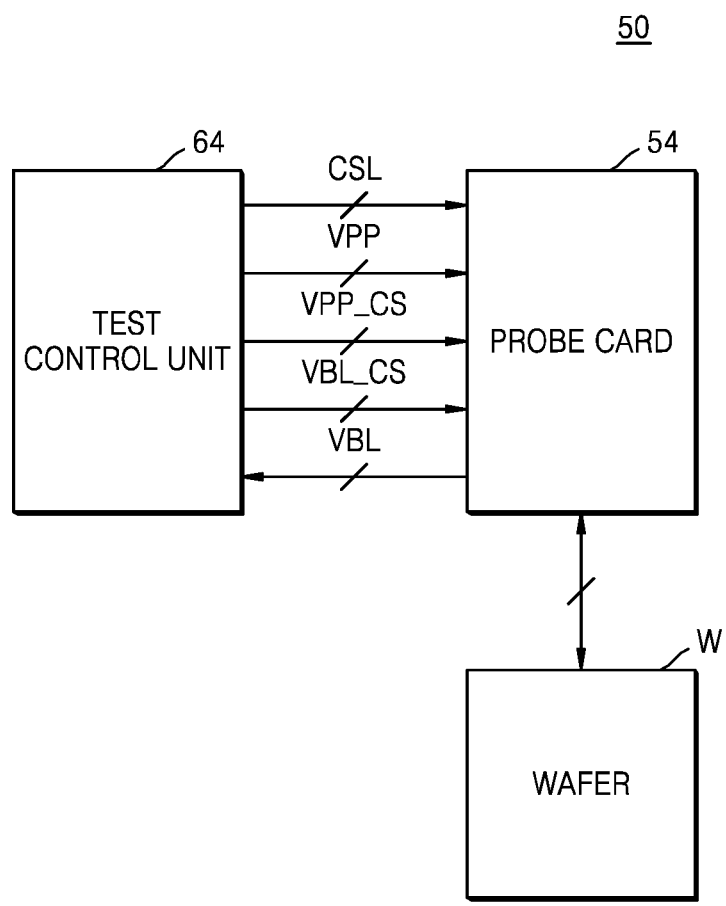
Figure 5:
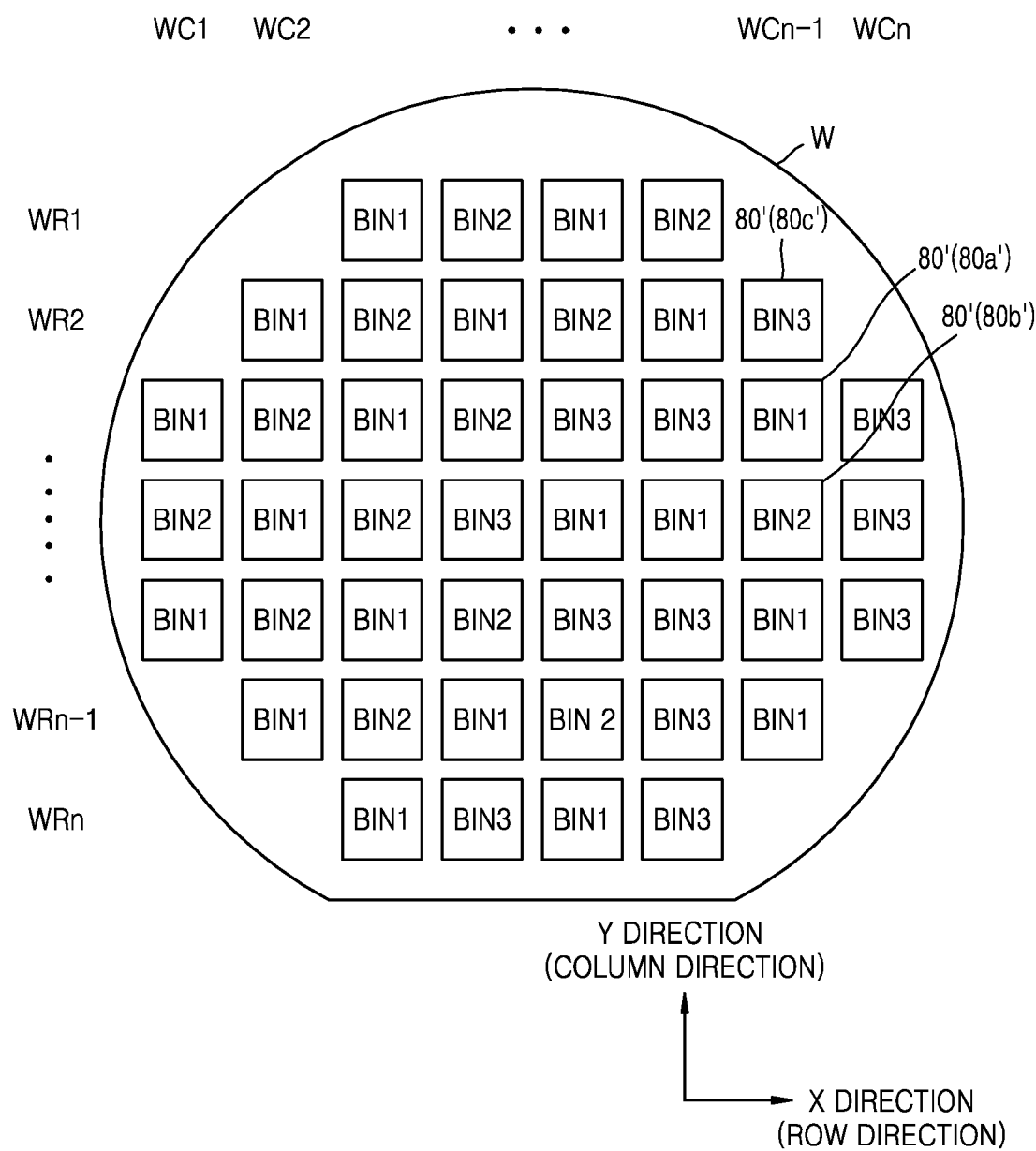

FIGS. 3 to 5 are diagrams illustrating an operation or process of obtaining an individual chip in the method of FIGS. 1 and 2.

Specifically, FIG. 3 is a schematic cross-sectional view of a wafer tester 50 including a probe card 54. FIG. 4 is a block diagram of a method of testing a wafer W by using the wafer tester 50 in an EDS process. FIG. 5 is a plan view of a plurality of individual chips 80, which are formed on the wafer W and classified according to test bin items BIN1 to BIN3.

As shown in FIG. 5, in a method of manufacturing a semiconductor device, a plurality of semiconductor devices 80', which are located apart from one another on the wafer W, may be manufactured by using a wafer process. Each of the semiconductor devices 80' may form an individual chip 80 after being cut from the wafer W. Furthermore, as shown in FIG. 5, in the method of manufacturing the semiconductor device, an electrical die sorting (EDS) process may be performed so that a plurality of semiconductor devices 80', which are classified according to the test bin items BIN1 to BIN3, may be obtained by testing semiconductor devices 80' while still connected integrally formed with one another on the wafer W.

The semiconductor devices 80' may be partitioned on the wafer W in a row direction (X direction) and a column direction (Y direction) and spaced apart from one another (e.g., via a scribe region). WR1 to WRn (n is an integer ranging from several to several tens) rows of semiconductor devices 80' may be arranged in the column direction, and WC1 to WCn (n is an integer ranging from several to several tens) columns of semiconductor devices 80' may be arranged in the row direction. The number of semiconductor devices 80' may be determined as needed.

The EDS process may be a process of inspecting electrical characteristics of each of the semiconductor devices 80' at the wafer level (prior to being cut from wafer W to form corresponding individual chips 80) before a packaging process is performed. The EDS process may include which of the semiconductor devices 80' formed on the wafer W are defective, repairing reparable semiconductor devices, and identifying irreparable semiconductor devices to prevent them from being further processed, thereby reducing time and costs.

Furthermore, the EDS process may include testing all the semiconductor devices 80' formed on the wafer W and classifying the chips according to a test bin item. The test bin items BIN1 to BIN3 may be electrical characteristic items used to test the semiconductor devices 80' formed on the wafer W.

The test bin items BIN1 to BIN3 of the EDS process may be at least one of items associated with electrical characteristics, such as voltage I/O characteristics, current I/O characteristics, leakage characteristics, functional characteristics, and timing characteristics of individual devices (e.g., a transistor, a resistor, a capacitor, and a diode) required for operations of the IC included in the semiconductor devices 80'. The number of test bin items is not limited to three, for example, the number of test bin items may be two, four or more. For example, a particular bin number may be identified as a bad device for all the electrical characteristics.

In particular, a semiconductor package manufactured by packaging the chip 80 during a back-end process may be used for different purposes in different environments depending on operating characteristics and reliability. Furthermore, as semiconductor devices have become more highly integrated, test parameters indicating operating characteristics or reliability have been further subdivided. Thus, the EDS process according to the inventive concept may include classifying and testing the electrical characteristic items as described above.

In FIG. 5, a device 80a' may indicate a good semiconductor device 80a' for electrical characteristics having a test bin item BIN1. The test bin item BIN2 may mean leakage characteristics, and a semiconductor device 80b' may be identified as a device for the electrical characteristics other than leakage characteristics having a test bin item BIN2. The test bin item BIN3 may mean functional characteristics or timing characteristics, and a semiconductor device 80c' may be a good device for the electrical characteristics other than functional characteristics or timing characteristics having a test bin item BIN3.

Although three test bin items BIN1 to BIN3 are indicated in FIG. 5 for brevity, there may be more test bin items according to a test level of the EDS process. Hereinafter, the wafer tester 50 used in the EDS process and a method of testing wafer-level devices using the wafer tester 50 will be described.

As shown in FIG. 3, the wafer W may be located on a wafer chuck 52. The probe card 54 may be installed on a head plate 62 provided over the wafer chuck 52.

The probe card 54 may include a printed circuit board (PCB) 56, needle-type tips (or needles) 58 adhered to a bottom surface of the PCB 56, a height adjusting device 60 functioning as a stopper configured to limit a vertical descent height of the probe card 54, and a pressure sensor 66 configured to sense pressure applied to the height adjusting device 60.

A result sensed by the pressure sensor 66 may be transmitted to a test control unit 64, and the test control unit 64 may analyze the result sensed by the pressure sensor 66 of the probe card 54 and automatically control vertical motion of the head plate 62. The wafer tester 50 may lower the head plate 62 toward the wafer W, bring the tips 58 into contact with the wafer W, and test the semiconductor devices 80'.

The test control unit 64 may exchange test signals with the semiconductor devices 80' formed on the wafer W to determine whether the semiconductor devices 80' are good or bad and also judge the test bin items BIN1 to BIN3. The test control unit 64 may transmit the test signals through the probe card 54.

When internal signals are output by the semiconductor devices 80' formed on the wafer W in response to the test signals, the test control unit 64 may receive the internal signals and determine whether the semiconductor devices 80' formed on the wafer W are good or bad and judge the test bin items BIN1 to BIN3. Although the configurations and operations of the wafer tester 50 and the probe card 54 are described above with reference to FIG. 3, they are only examples and may be variously changed.

FIG. 4 illustrates a process of testing, voltage I/O characteristics as an example of the test bin items. The test control unit 64 may generate a chip selection signal CSL, a high power supply voltage VPP, a bit line voltage control signal VBL_CS, and a high power supply voltage control signal VPP_CS to test a plurality of semiconductor devices 80' formed on the wafer W.

The chip selection signal CSL may be a signal for selecting a semiconductor device 80' to be tested, from among the plurality of chips 80 formed on the wafer W. The high power supply voltage control signal VPP_CS may be a signal for controlling the supply of a high power supply voltage VPP to the selected semiconductor device 80' in response to the chip selection signal CSL. The bit line voltage control signal VBL_CS may be a signal for controlling the test control unit 64 to receive a bit line voltage VBL output from the selected semiconductor device 80'. It should be appreciated that plural semiconductor devices 80' may be simultaneously (e.g., including applying appropriate ones of the signals described herein to the semiconductor devices 80' to be tested)

The probe card 54 may function to transmit signals between the test control unit 64 and the wafer W under the control of the test control unit 64. For example, the probe card 54 may select one or more semiconductor devices 80' to be tested, from among the semiconductor devices 80' of the wafer W, in response to the chip selection signal CSL from the test control unit 64, and supply the high power supply voltage VPP from the test control unit 64 to the selected semiconductor device 80' in response to high power supply voltage control signals VPP_CS.

In this case, the selected semiconductor device 80', which receives the high power supply voltage VPP and is powered on, may internally generate and output the bit line voltage VBL. The probe card 54 may sequentially transmit the bit line voltages VBL, which is generated by the selected semiconductor device 80', to the test control unit 64 in response to the bit line voltage control signal VBL_CS and test voltage input/output (I/O) characteristics from among the test bin items.

FIGS. 6 to 10 are diagrams of an operation of forming a plurality of individual packages in the method of manufacturing the semiconductor device of FIGS. 1 and 2 according to example embodiments.

Figure 6:
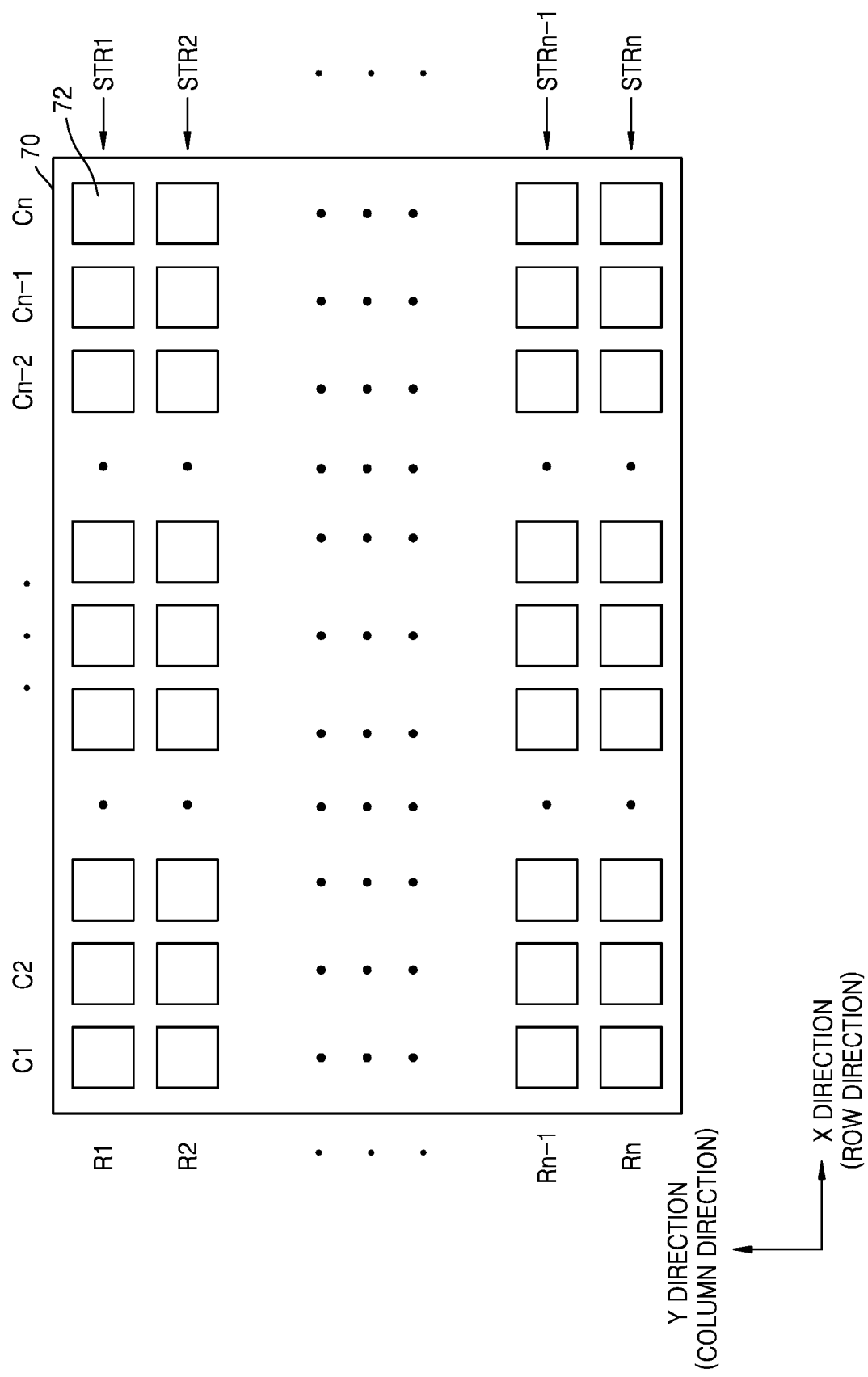
FIGS. 6 to 10 are diagrams of operation of forming a plurality of individual packages in the method of manufacturing the semiconductor device of FIGS. 1 and 2 according to example embodiments.
Figure 7:
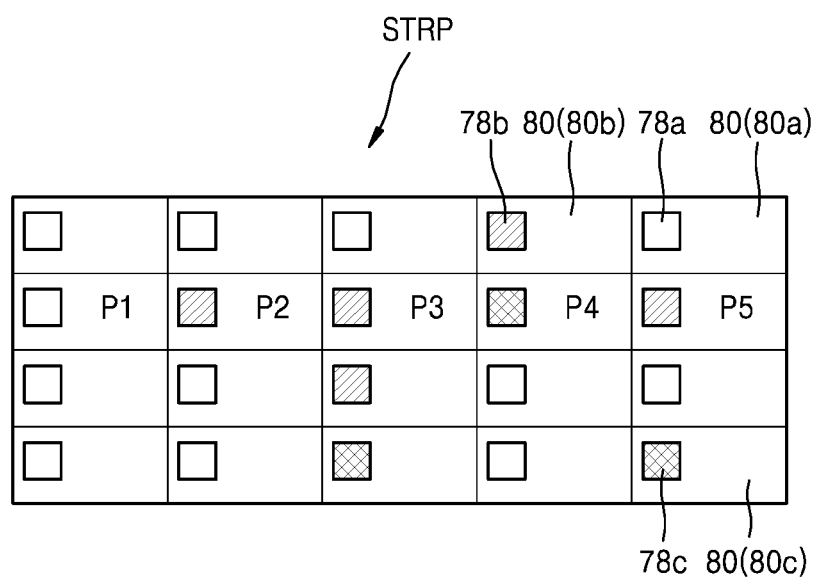
Figure 8:
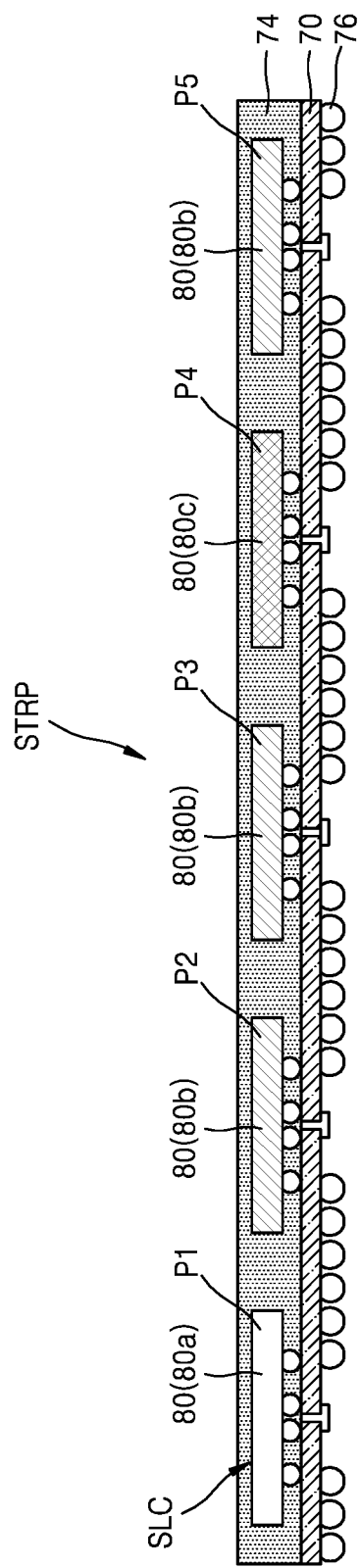
Figure 9:
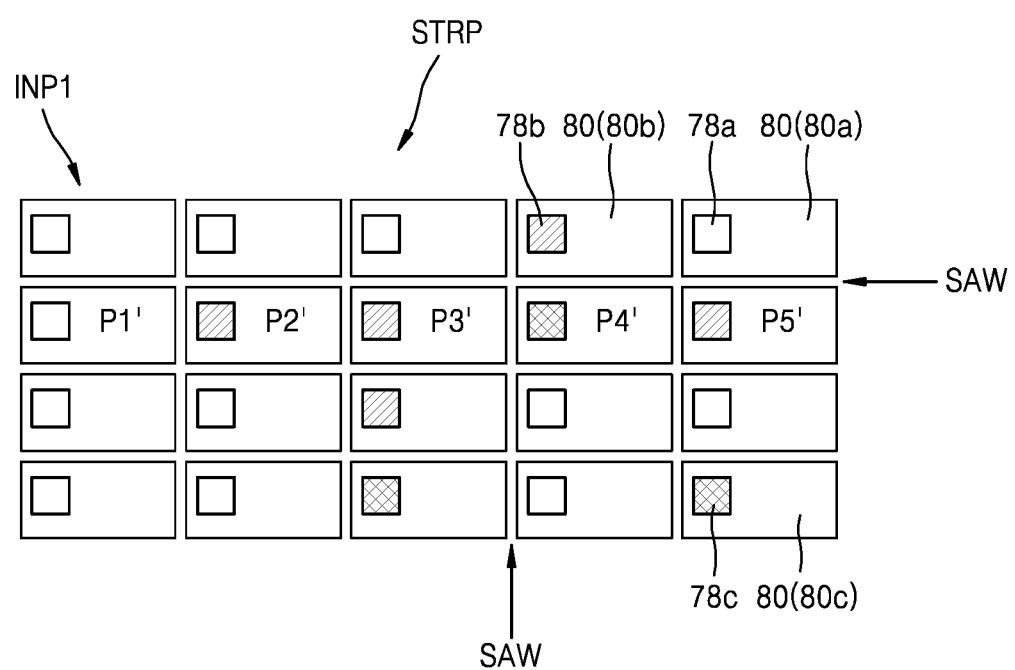
Figure 10:
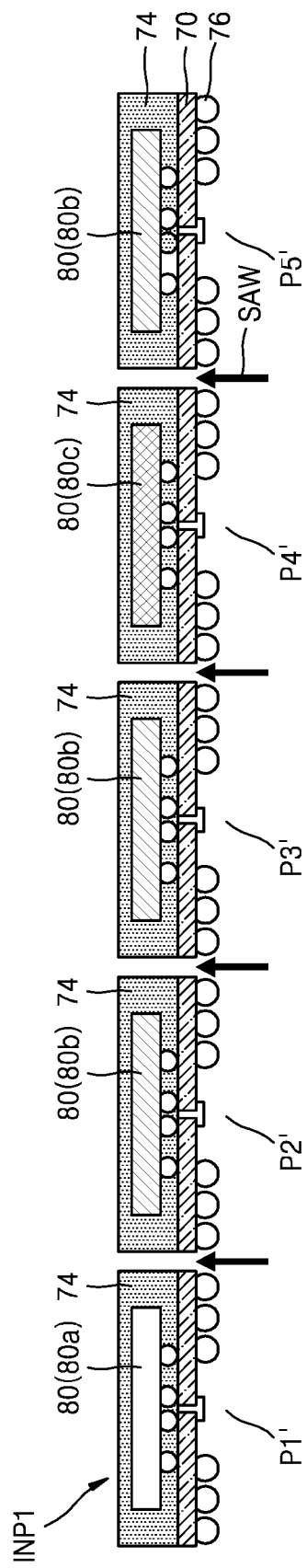

Specifically, FIG. 6 is a plan view of a circuit substrate 70 having a plurality of chip mounting regions 72. FIGS. 7 and 8 are respectively a plan view and a cross-sectional view of a strip package STRP including individual chips 80 mounted on the circuit substrate 70. FIGS. 9 and 10 are a plan view and a cross-sectional view of an individual package INP1 including the individual chips 80 mounted on the circuit substrate 70.

In the method 10 of manufacturing the semiconductor device, a plurality of individual packages INP1 may be formed by packaging the individual chips 80 on the circuit substrate 70. The operation of forming the individual package INP1 will be described in detail below.

The circuit substrate 70 may be prepared. The circuit substrate 70 may include a plurality of chip mounting regions 72, which are spaced apart from one another as shown in FIG. 6. The chip mounting regions 72 may be partitioned on the circuit substrate 70 in a row direction (X direction) and a column direction (Y direction) and spaced apart from one another.

R1 to Rn (n is an integer ranging from several to several tens) rows of chip mounting regions 72 may be arranged in the column direction, and C1 to Cn (n is an integer ranging from several to several tens) columns of chip mounting regions 72 may be arranged in the row direction. The number of the chip mounting regions 72 may be determined as needed.

The circuit substrate 70 may include a plurality of strips STR1-STRn (n is an integer ranging from several to several tens) in which the chip mounting regions 72 are aligned in any one direction (e.g., the row direction) of the row direction and the column direction.

The circuit substrate 70 may be referred to as a strip circuit substrate because several ones of the chip mounting regions 72 are aligned in at least one direction forming a strip (here, several strips STR1-STRn are identified as rows, but strips may also be considered to be formed from columns of chip mounting regions 72).

In example embodiments, in a method of manufacturing a semiconductor device, position information of each of the chip mounting regions 72 on the circuit substrate 70 may be used. The position information may be in the form of X, Y coordinates.

As shown in FIG. 7, each of the individual chips 80 may be attached to a corresponding chip mounting region 72 of the circuit substrate 70. Each of the individual chips 80 may be a corresponding one of the semiconductor devices 80' as described herein after being cut from a wafer W. A strip package STRP may be formed including a molding layer obtained by molding the individual chips 80 on the circuit substrate 70 with a molder. Test bin item information 78a to 78c corresponding to the test bin items BIN1 to BIN3, respectively, may be marked on a surface of the molding layer over each of the individual chips with a marker based on position information of the chip mounting regions.

For example, the individual chips 80 (80a, 80b, and 80c) may be attached to the chip mounting regions 72 of the circuit substrate 70, respectively, based on a test bin item.

In example embodiments, a chip attacher may have test bin item information of the individual chips (obtained by wafer level testing described herein) and position information of each of the chip mounting regions 72 of the circuit substrate 70. For example, the chip attacher may attach each of the individual chips having test bin item information to a corresponding chip mounting region 72 having X, and Y coordinates of the circuit substrate 70. Thus, the strip package STRP may include the individual chips 80 (80a, 80b, and 80c) attached and positioned in the circuit substrate 70 based on the test bin item.

As shown in FIG. 8, each of the individual chips 80 (i.e., a single chip SLC) may be attached to a corresponding chip mounting region 72. For brevity, FIG. 8 illustrates a case in which the individual chip 80 is attached to the circuit substrate 70 by using a ball land.

Specifically, as shown in FIG. 8, one row of a strip package STRP including a molding layer 74 obtained by molding the individual chips 80 formed on the chip mounting regions 72 of the circuit substrate 70 may be formed. For example, several packages P1 to P5 arranged in a row of the strip package STRP correspond to packages P1 to P5 arranged in a second row of the circuit substrate 70 in FIG. 7. The molding layer 74 may mold the individual chips 80 with an epoxy resin and protect the individual chips 80. The strip package STRP may include external connection terminals formed on a bottom surface of the circuit substrate 70 to connect the individual chip 80 with an external device.

Thereafter, as shown in FIG. 7, test bin item information 78a to 78c may be marked on a surface of the molding layer 74 according to the individual chips based on position information of the chip mounting regions 72 of the circuit substrate 70. When necessary, additional information (e.g., a product number) of the individual chip 80 may be marked on the surface of the molding layer 74 over each of the individual chips.

The test bin item information 78a may correspond to the test bin item BIN1 of the individual chip 80a, which is shown in FIG. 5 as semiconductor device 80a'. The test bin item information 78b may correspond to the test bin item BIN2 of the individual chip 80b, which is shown in FIG. 5 as semiconductor device 80b'. The test bin item information 78c may correspond to the test bin item BIN3 of the individual chip 80c, which is shown in FIG. 5 semiconductor device 80c'. In this example, the test bin item information 78a to 78c is not illustrated in FIG. 8 because FIG. 8 shows a cross-section of the strip package STRP.

As shown in FIGS. 9 and 10, the strip package STRP in which the individual chips 80 are packaged on the circuit substrate 70 may be sawed by using a blade SAW of a package sawing apparatus to form individual packages INP1. For example, the individual packages INP1 may include individual packages P1' to P5' which are sawed as shown in FIG. 9 correspond to individual packages P1' to P5' in FIG. 10. The individual packages INP1 may have the test bin item information 78a corresponding to the test bin item BIN1, the test bin item information 78b corresponding to the test bin item BIN2, and the test bin item information 78c corresponding to the test bin item BIN3.

Figure 11:
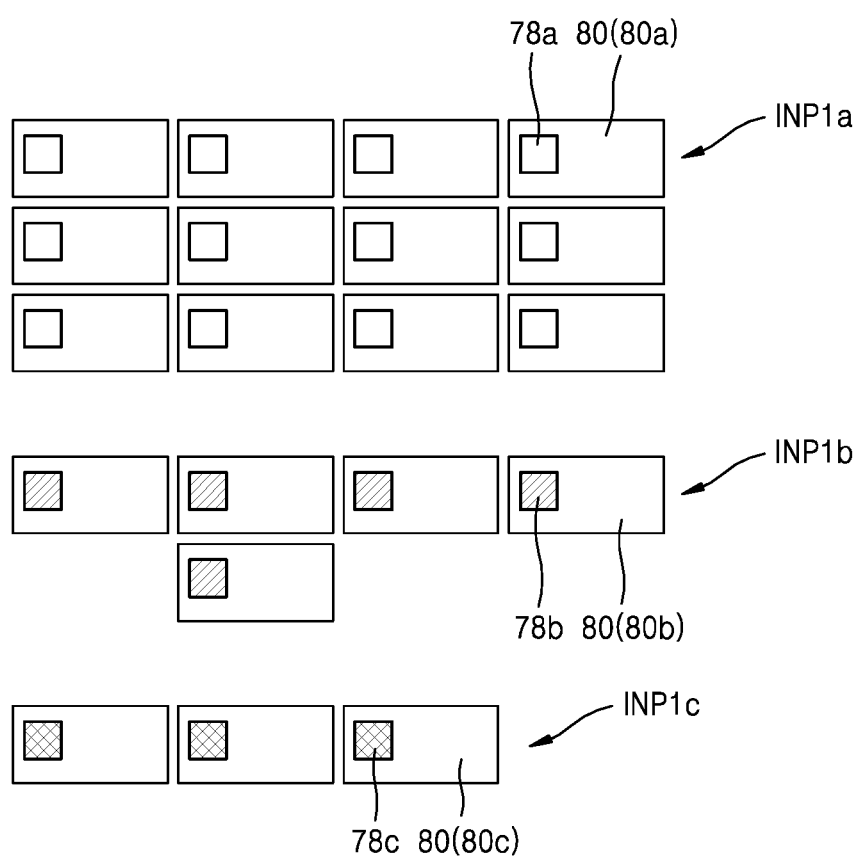
FIG. 11 is a diagram of an operation of classifying the individual packages according to test bin item in the method of manufacturing the semiconductor device of FIGS. 1 and 2 according to example embodiments.
Figure 12:
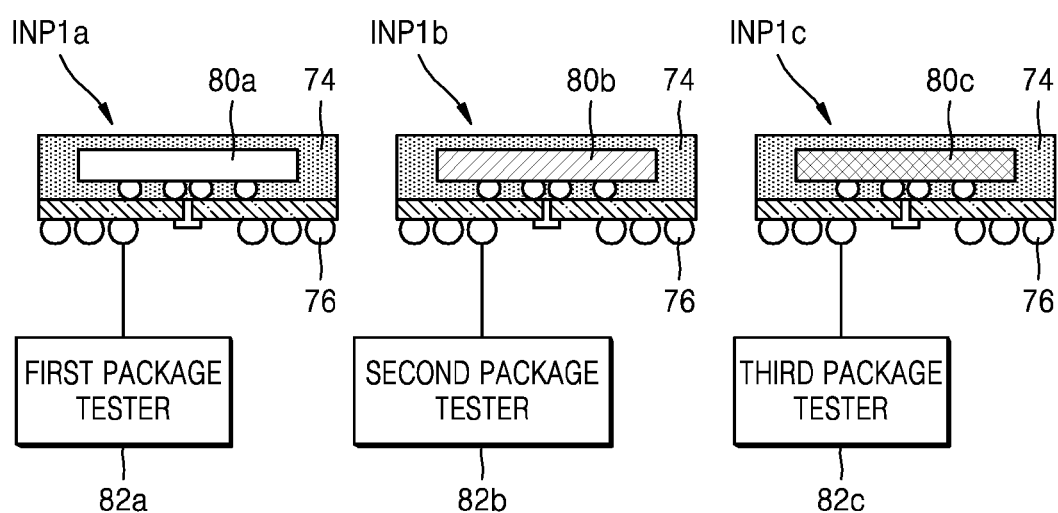
FIG. 12 is a diagram of an operation of testing the individual packages in the method of manufacturing the semiconductor device of FIGS. 1 and 2 according to example embodiments.

FIG. 11 is a diagram of an operation of classifying individual packages according to a test bin item in the method of manufacturing the semiconductor device of FIGS. 1 and 2 according to example embodiments. FIG. 12 is a diagram of an operation of testing individual packages in the method of manufacturing the semiconductor device of FIGS. 1 and 2 according to example embodiments.

Specifically, as described above with reference to FIGS. 9 and 10, the individual packages INP1 may have the test bin item information 78a corresponding to the test bin item BIN1, the test bin item information 78b corresponding to the test bin item BIN2, and the test bin item information 78c corresponding to the test bin item BIN3.

As shown in FIG. 11, the individual packages INP1 may be classified according to a test bin item. For example, the individual packages INP1 may be classified according to the test bin item information 78a, 78b, and 78c. As a result, the individual packages INP1 may be separated into a first set of individual packages INP1a having the test bin item information 78a, a second set of individual packages INP1b having test bin item information 78b, and a third set of individual packages INP1c having test bin item information 78c.

As shown in FIG. 12, the first to third sets of individual packages INP1a, INP1b, and INP1c classified according to the test bin items BIN1 to BIN3, respectively, may be tested. In one embodiment, the first set of individual packages INP1a having the test bin item BIN1 may be tested by a first package tester 82a, the second set of individual packages INP1b having the test bin item BIN2 may be tested by a second package tester 82b, and the third set of individual packages INP1c having the test bin item BIN3 may be tested by a third package tester 82c. In other embodiment, the first to third sets of individual packages INP1a to INP1c may be tested by the same package tester.

In one embodiment, the classified first to third sets of individual packages INP1a to INP1c may be tested for electrical characteristics other than the test bin item. Thus, by separating and testing the first to third set of individual packages INP1a, INP1b, and INP1c based on the test bin items BIN1 to BIN3, a process may be simplified, and reliability of the semiconductor device may be increased.

Figure 13:
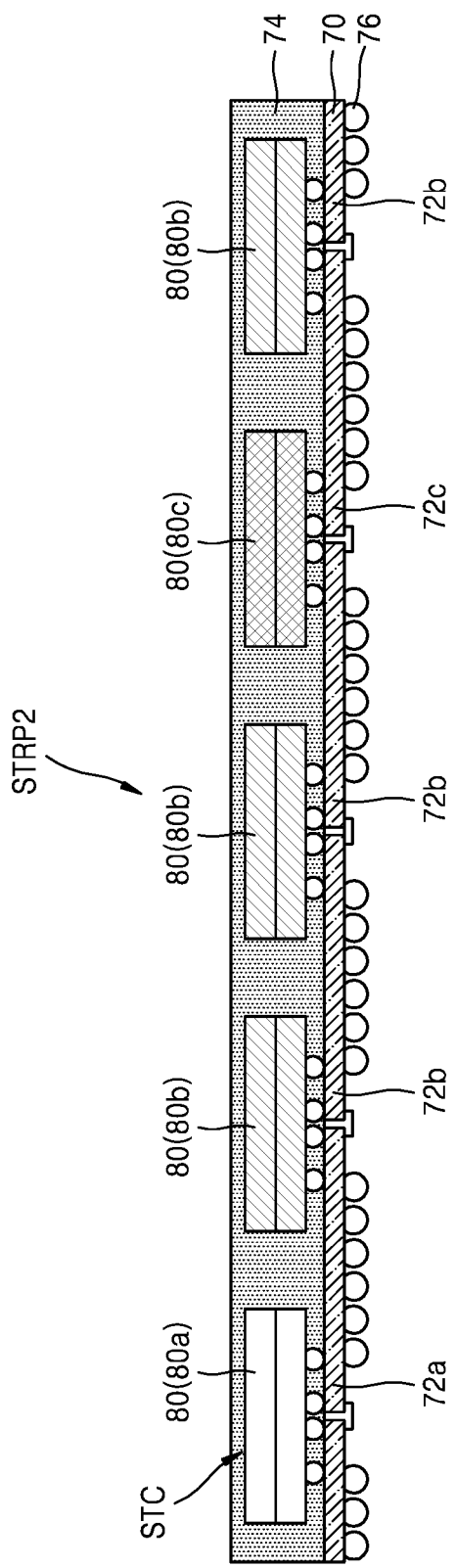
FIGS. 13 to 15 are diagrams of a method of manufacturing a semiconductor device according to example embodiments.
Figure 14:
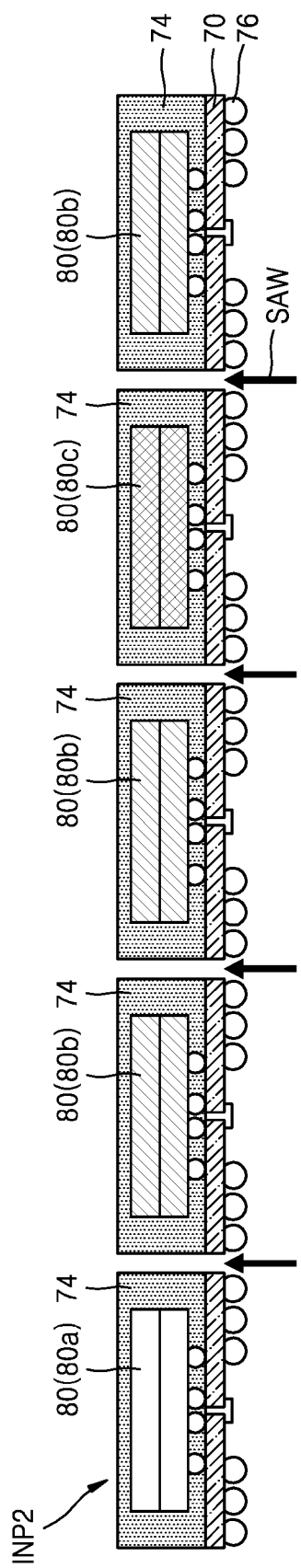
Figure 15:
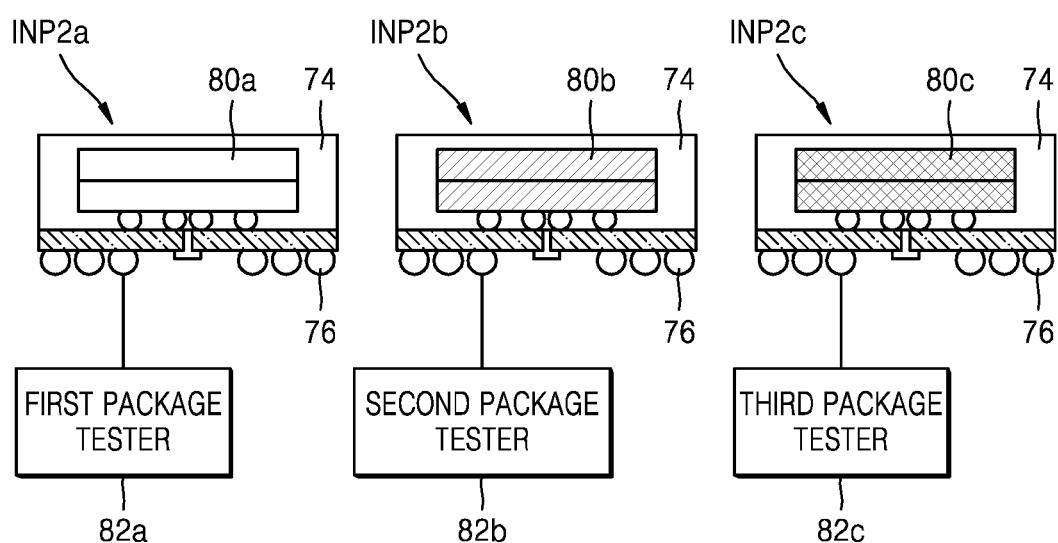

FIGS. 13 to 15 are diagrams illustrating a method of manufacturing a semiconductor device according to example embodiments.

Specifically, the method of manufacturing the semiconductor device shown in FIGS. 13 to 15 may be the same as the method of manufacturing the semiconductor device shown in FIGS. 8 to 12 except that a stacked chip STC is formed by stacking two individual chips 80 on a circuit substrate 70. In FIGS. 13 to 15, the same portions as those described above will be briefly described or omitted.

As shown in FIG. 13, the strip package STRP2 in which a plurality of stacked chip STC are packaged on the circuit substrate 70. A plurality of stacked chips STC may be attached to chip mounting regions 72 of the circuit substrate 70, respectively. For example, two individual chips of the individual chips 80 (i.e., the stacked chip STC) may be attached to a chip mounting region 72. The two individual chips 80 may be electrically connected to each other by using through vias, for example, through-silicon vias (TSV) or by using wires.

Two individual chips 80 may be stacked on and attached to one chip mounting region 72 based on test bin items. Two individual chips 80a in one stacked chip having the test bin item BIN1 may be attached to one chip mounting region 72a, two individual chips 80b in one stacked chip having the test bin item BIN2 may be attached to another chip mounting region 72b, and two individual chips 80c in one stacked chip having the test bin item BIN3 may be attached to still another chip mounting region 72c.

As shown in FIG. 14, the strip package STRP2 in which the individual chips 80 are packaged on the circuit substrate 70 may be sawed by a blade SAW of the package sawing apparatus to form individual packages INP2.

The individual packages INP2 may be classified according to a test bin item. For example, the individual packages INP2 may be classified according to the test bin item information 78a, 78b, and 78c. As a result, the individual packages INP2 may be separated into a first set of individual packages INP2a including the individual chips 80a having test bin item information 78a corresponding to the test bin item BIN1, a second set of individual packages INP2b including the individual chips 80b having test bin item information 78b corresponding to the test bin item BIN2, and a third set of individual packages INP2c including the individual chips 80c having test bin item information 78c corresponding to the test bin item BIN3.

As shown in FIG. 15, the first to third sets of individual packages INP2a, INP2b, and INP2c classified according to the test bin items BIN1-BIN3, respectively may be tested. In one embodiment, the first set of individual packages INP2a having the test bin item BIN1 may be tested by a first package tester 82a. The second set of individual packages INP2b having the test bin item BIN2 may be tested by a second package tester 82b. The third set of individual packages INP2c having the test bin item BIN3 may be tested by a third package tester 82c. In other embodiment, the first to third sets of individual packages INP2a to INP2c may be tested by the same package tester, where such testing may include using different testing procedures for each set of individual packages INP2a to INP2c.

In one embodiment, the classified first to third sets of individual packages INP2a to INP2c may be tested for electrical characteristics other than the test bin item, and all or some of the testing performed at the wafer level (as described herein) may be avoided when testing by the package tester. Thus, by separating and testing the first through third individual packages INP2a, INP2b, and INP2c based on the test bin items BIN1 to BIN3, a process may be simplified and reliability of a semiconductor device may be increased.

Figure 16A:
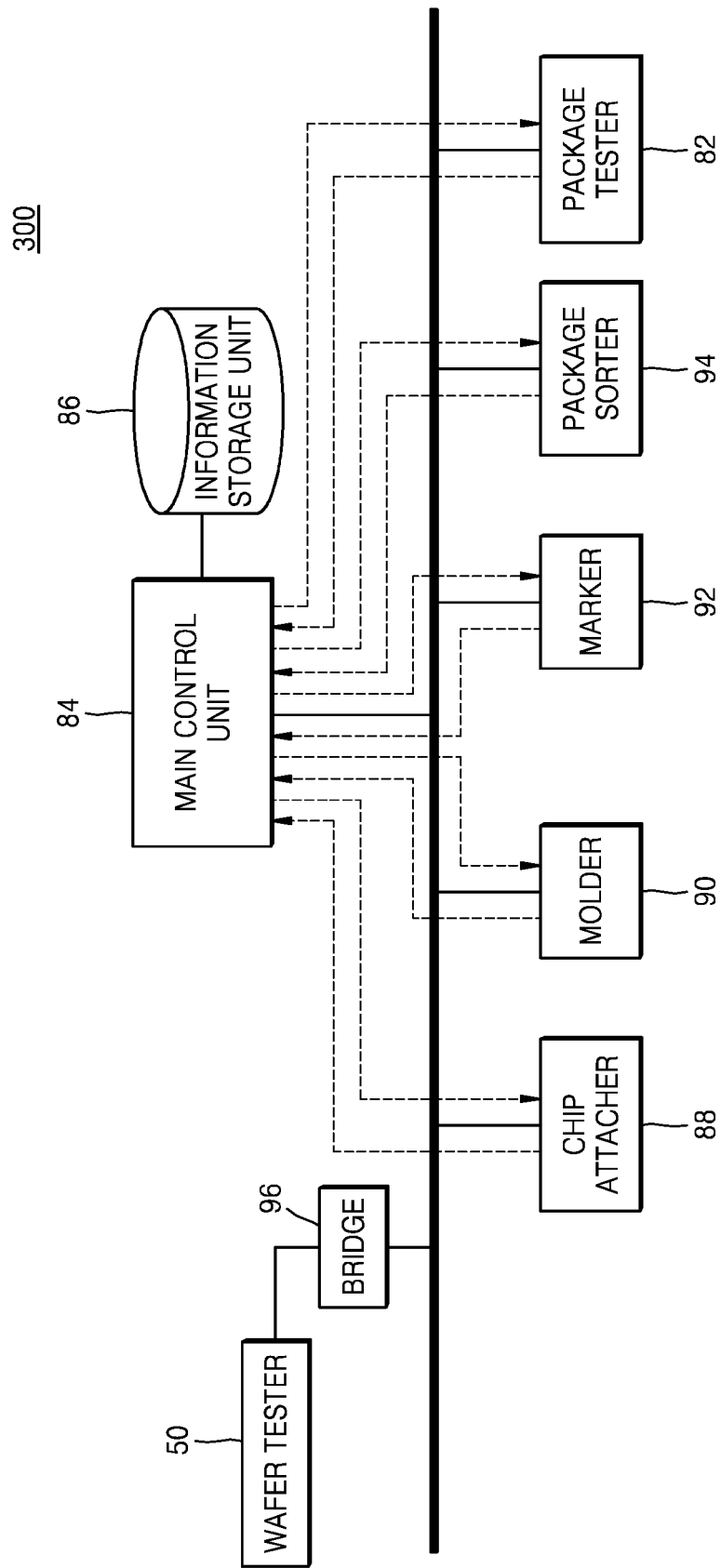
FIG. 16A is a schematic diagram of a semiconductor manufacturing facility for describing a method of manufacturing a semiconductor device according to example embodiments.
Figure 16B:
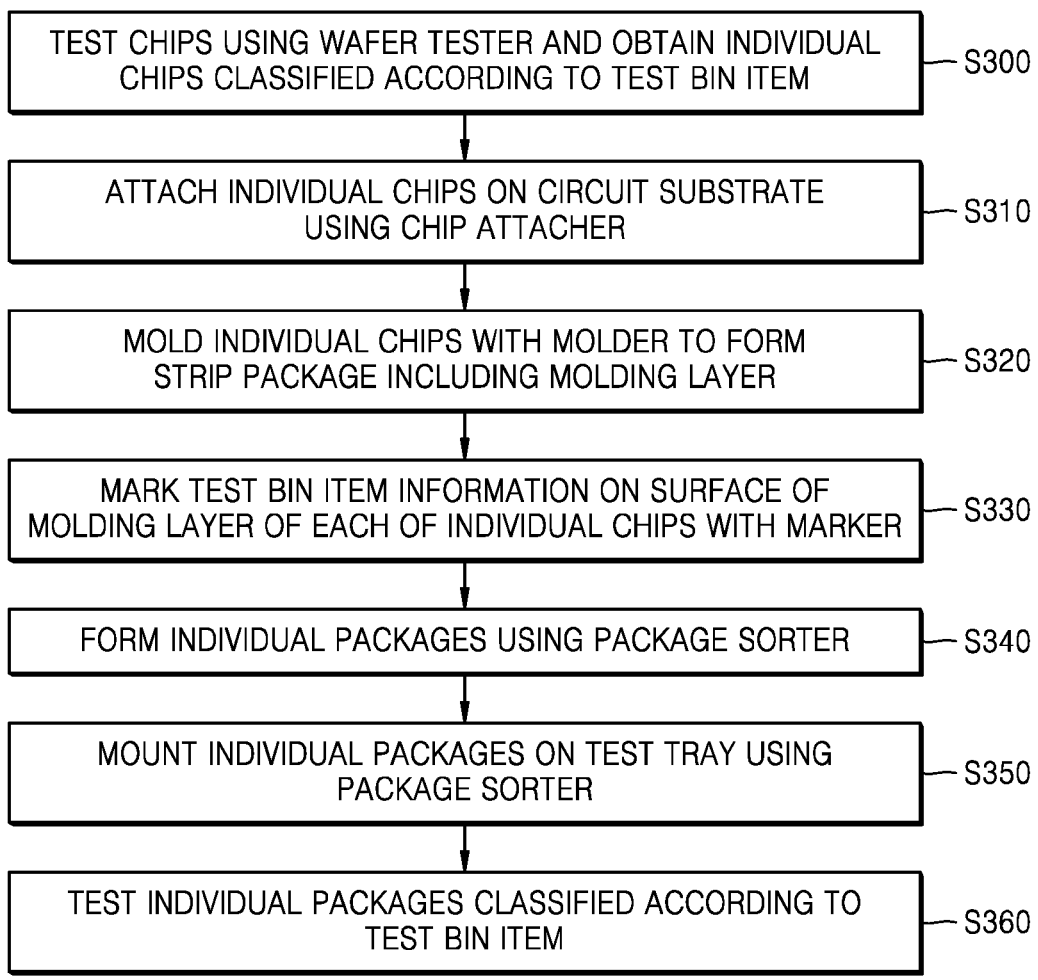
FIG. 16B is a flowchart of a method of manufacturing a semiconductor device using a semiconductor manufacturing facility according to example embodiments.

FIG. 16A is a schematic diagram of a semiconductor manufacturing facility 300, illustrating a method of manufacturing a semiconductor device according to example embodiments. FIG. 16B is a flowchart of a method of manufacturing a semiconductor device using a semiconductor manufacturing facility according to example embodiments.

To begin with, as shown in FIG. 16A, the semiconductor manufacturing facility 300 may include a main control unit 84, an information storage unit 86, a chip attacher 88, a molder (or molding device) 90, a marker (or marking device) 92, a package sorter 94, and a package tester (or package test device) 82. The semiconductor manufacturing facility 300 is not limited to the example shown in FIG. 16A but may include other components.

The main control unit 84 may be electrically connected to a wafer tester 50. The main control unit 84 may receive test bin item information of chips formed on a wafer from the wafer tester 50 through a bridge 96.

For example, the main control unit 84 may receive information about a plurality of individual chips, which are classified according to a test bin item, from the wafer tester 50. The information storage unit 86 may store data received from the main control unit 84.

The main control unit 84 may be electrically connected to the information storage unit 86, the chip attacher 88, the molder 90, the marker 92, the package sorter 94, and the package tester 82.

The main control unit 84 may transmit and receive electric signals to and from the information storage unit 86, the chip attacher 88, the molder 90, the marker 92, the package sorter 94, and the package tester 82. The main control unit 84 may receive position information of each of chip mounting regions in the circuit substrate from the chip attacher 88 and mark test bin item information on a surface of a molding layer of each of the individual chips with the marker 92 based on the position information of each of the chip mounting regions.

In addition, the chip attacher 88, the molder 90, the marker 92, the package sorter 94, and the package tester 82 may be electrically connected to one another through the main control unit 84. Thus, the chip attacher 88, the molder 90, the marker 92, the package sorter 94, and the package tester 82 may transmit and receive electric signals between one another. Furthermore, a chip attaching process to an individual-package testing process may be performed by the above-described main control unit 84.

Next, a method of manufacturing a semiconductor device using a semiconductor manufacturing facility will be described. Hereinafter, the method of manufacturing the semiconductor device by using the semiconductor manufacturing facility will be briefly described, and the same descriptions as with reference to FIGS. 1 to 15 will be briefly presented or omitted.

As shown in FIG. 16B, a method 20 of manufacturing the semiconductor device may include an operation S300 of testing a plurality of chips by using a wafer tester 50 and obtaining a plurality of individual chips classified according to a test bin item and an operation S310 of attaching the individual chips to a circuit substrate by using a chip attacher 88.

Specifically, operation S300 of obtaining the plurality of individual chips may include testing electrical characteristics of the plurality of chips by using the wafer tester 50 on a wafer level and obtaining the plurality of individual chips, which are classified according to the test bin item. Operation S310 of attaching the individual chips to the circuit substrate may include attaching the individual chips to a plurality of chip mounting regions of the circuit substrate by using the chip attacher 88.

The method 20 of manufacturing the semiconductor device may include forming a strip package including a molding layer obtained by molding the individual chips with the molder 90 (S320) and marking test bin item information on the surface of the molding layer of each of the individual chips with the marker 92 (S330).

The strip package may be manufactured to include the molding layer obtained by molding individual chips on the circuit substrate with the molder 90. The test bin item information may be marked on the surface of the molding layer of each of the individual chips with the marker 92 based on position information about the chip mounting regions of the circuit substrate.

In other words, test bin item information about the chips formed on a wafer may be received from the above-described wafer tester 50, and position information of the circuit substrate may be received from the chip attacher 88. Thereafter, the test bin item information may be marked on the surface of the molding layer over each of the individual chips with the marker 92.

The method 20 of manufacturing the semiconductor device may include forming a plurality of individual packages by using a package sorter 94 (S340) and mounting the individual packages on a test tray by using the package sorter 94 (S350).

The strip package may be sawed by the individual chips by using a blade SAW of the package sorter 94 to obtain the individual packages. The individual packages may be classified by using the package sorter 94 based on test bin item information and mounted on the test tray.

The method 20 of manufacturing the semiconductor device may include testing the individual packages by using the package tester 82 (S360). The individual packages classified according to the test bin item may be tested by using the package tester 82.

Figure 17:
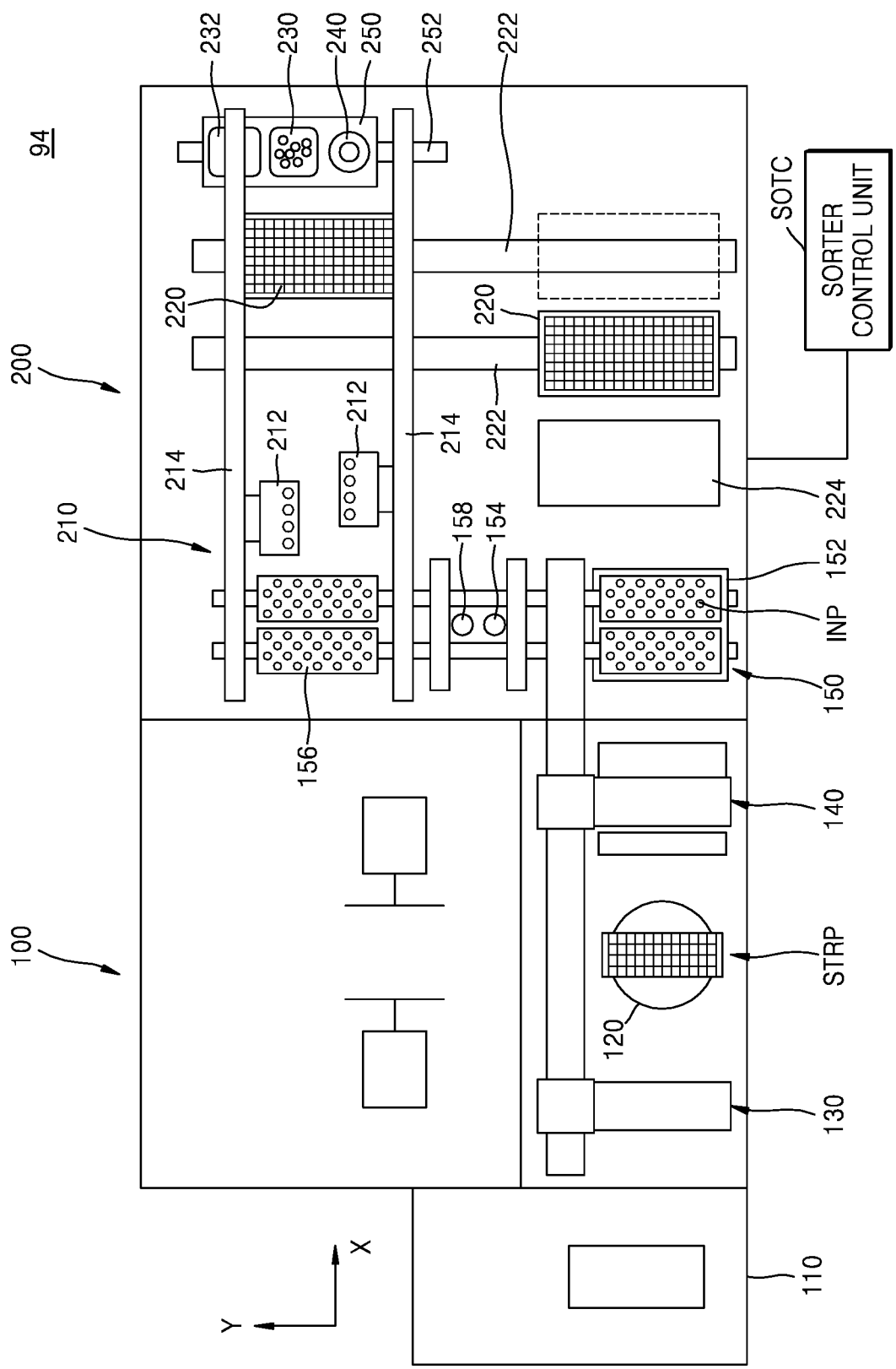
FIG. 17 is a construction diagram of an example of a package sorter used in a method of manufacturing a semiconductor device according to example embodiments.
Figure 18:
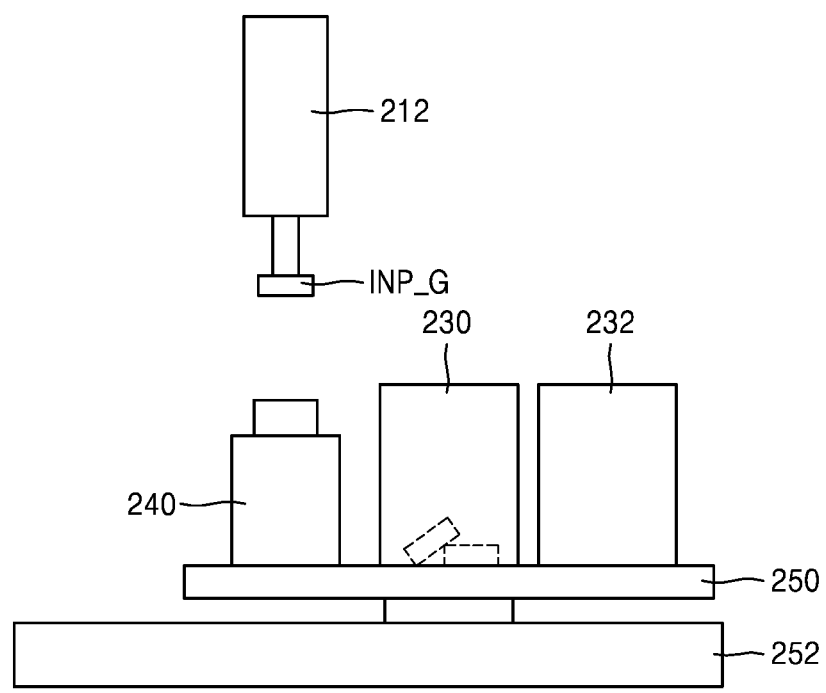
FIGS. 18 and 19 are schematic side views of an operation of a second inspection module shown in FIG. 17 according to example embodiments.
Figure 19:
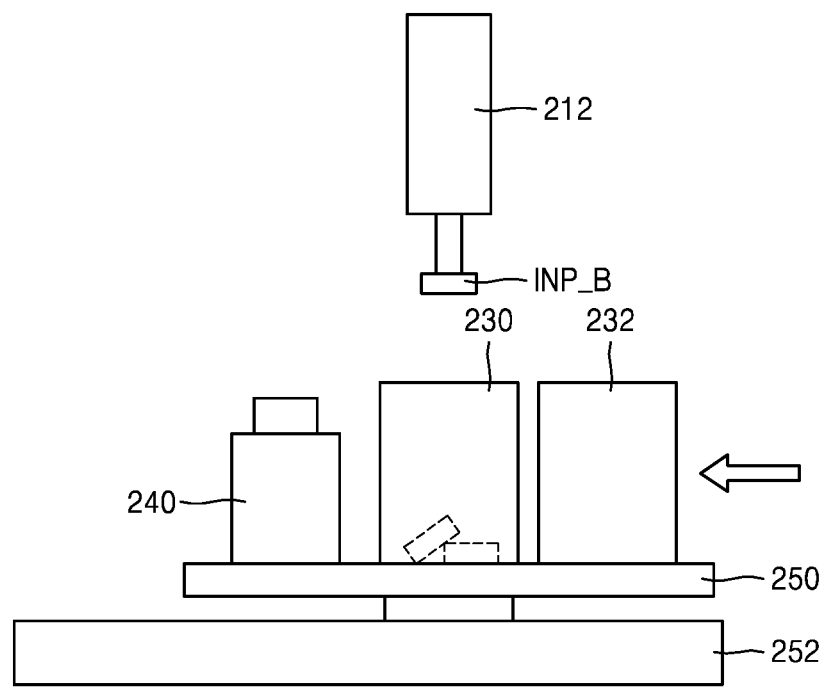
Figure 20:
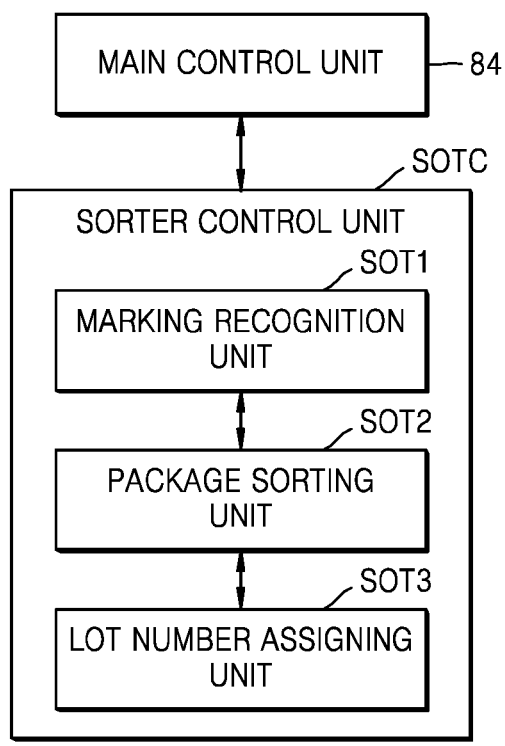
FIG. 20 is a block diagram of configuration of a sorter control unit of a package sorter according to example embodiments.

FIG. 17 is a construction diagram of an example of a package sorter 94 used in a method of manufacturing a semiconductor device according to example embodiments. FIGS. 18 and 19 are schematic side views of an operation of a second inspection module shown in FIG. 17 according to example embodiments. FIG. 20 is a block diagram of a configuration of a sorter control unit of the package sorter 94 according to example embodiments.

Specifically, the package sorter 94 used in the method of manufacturing the semiconductor device according to the embodiment may include both a package sawing apparatus 100 and a package classification device 200. The package sawing apparatus 100 may be configured to saw a strip package STRP and form individual packages INP. The package classification device 200 may classify the individual packages INP depending on whether the individual packages INP are good and based on test bin item information and mount the classified individual packages INP on a test tray 220. The package sorter 94 may be connected to a sorter control unit SOTC, which may be connected to the main control unit 84 of the semiconductor manufacturing facility 300 described above with reference to FIG. 16A.

The package sawing apparatus 100 may include a loader 110 configured to support a cassette in which the strip package STRP is contained and supply the strip package STRP, a sawing module 120 configured to cut and individualize the strip package STRP, a transfer module 130 configured to transfer the strip package STRP or the individual packages INP, and a cleaning module 140 configured to clean and dry the individual packages INP.

The package classification device 200 may include a first inspection module 150 configured to inspect the individual packages INP. The package classification device 200 may be used to classify the individual packages INP into good individual packages INP_G and bad individual packages INP_B based on results obtained by inspecting the individual packages INP using the first inspection module 150.

The first inspection module 150 may include a reverse unit 152 configured to support the individual packages INP such that first surfaces of the individual packages INP face upward, a first inspection unit 154 configured to inspect the first surfaces of the individual packages INP supported on the reverse unit 152, a table 156 configured to support the individual packages INP reversed by the reverse unit 152, and a second inspection unit 158 configured to inspect second surfaces of the individual packages INP supported on the table 156.

The table 156 may be configured to be capable of moving among a first inspection position under the reverse unit 152, a second inspection position under the second inspection unit 158, and a transmission position for transmitting the inspected individual packages INP to the package transfer unit 210. However, the configurations of the first inspection module 150 and the package sawing apparatus 100 may be variously changed, and thus, the inventive concept is not limited by detailed configurations of the first inspection module 150 and the package sawing apparatus 100.

The package classification device 200 may include a package transfer unit 210 including a picker 212 configured to pick up the individual packages INP from the table 156 on which the individual packages INP are placed and transfer the individual packages INP.

The package classification device 200 may include a test tray 220 configured to contain the good individual packages INP_G from among the individual packages INP and a container 230 configured to contain the bad individual packages INP_B from among the individual packages INP.

The package transfer unit 210 may be configured to move the picker 212 in a first direction (e.g., an X direction) and move the picker 212 in a second direction (e.g., a Y direction) in order to pick up and place the individual packages INP. For example, the package transfer unit 210 may include a picker driver 214 configured to move the picker 212 in the first direction and the second direction.

The picker driver 214 may rotate the picker 212 to align the individual packages INP picked by the picker 212, particularly, the good individual packages INP_G. Although FIG. 17 illustrates a case in which two package transfer units 210 are provided, the number of the package transfer units 210 may be variously changed, so the inventive concept is not limited by the number of the package transfer units 210.

The test tray 220 may be located under a first-direction moving path of the picker 212 and have a plurality of sockets configured to contain the good individual packages INP_G, respectively. Although FIG. 17 illustrates a case in which two test trays 220 are located, the number of the test trays 220 may be variously changed, so the inventive concept is not limited by the number of the test trays 220.

The test tray 220 may be configured to be capable of moving in a second direction (e.g., a Y direction) perpendicular to the first direction. The package classification device 200 may include a tray transfer unit 222 configured to move the test tray 220. The package classification device 200 may include a tray cassette 224 configured to contain the test tray 220.

The package classification device 200 may include a second inspection module 240 configured to inspect a state of the alignment of the good individual packages INP_G picked by the picker 212, classify the good individual packages INP_G based on test bin item information, and mount the classified good individual packages INP_G on the test tray 220. Containers 230 and 232 and the second inspection module 240 may be located on one stage 250. The containers 230 and 232 and the second inspection module 240 may be located under a moving path of the picker 212 to contain the bad individual packages INP_B and observe the good individual packages INP_G.

The package classification device 200 may include a stage driver 252 configured to move the containers 230 and 232 and the second inspection module 240 such that any one of the containers 230 and 232 and the second inspection module 240 is selectively located under the moving path of the picker 212. The containers 230 and 232 and the second inspection module 240 may be disposed in a direction (i.e., the Y direction) perpendicular to the moving path of the picker 212, and the stage driver 252 may move the stage 250 in the X direction.

When the good individual packages INP_G are picked up by the picker 212, the stage driver 252 may move the stage 250 such that the second inspection module 240 is located under the moving path of the picker 212 as shown in FIG. 18. Thus, the second inspection module 240 may inspect a state of the alignment of the good individual packages INP_G, classify the good individual packages INP_G based on test bin item information, and mount the classified good individual packages INP_G on the test tray 220.

The second inspection module 240 may capture an image of the good individual packages INP_G picked by the picker 212. The picker 212 may align the good individual packages INP_G by using the image and allow the socket of the test tray 220 to contain the good individual packages INP_G. For example, the picker 212 may rotate the good individual packages INP_G such that the picked good individual packages INP_G is precisely contained in the socket of the test tray 220. Thereafter, the good individual packages INP_G may be contained in the socket of the test tray 220.

As shown in FIG. 19, the second inspection module 240 may recognize an image (e.g., a number or an optical code) of the test bin item information of the good individual packages INP_G, which is marked on the surface of the molding layer, by using a marking recognition unit SOT1 of the sorter control unit SOTC. Furthermore, the marking recognition unit SOT1 of the sorter control unit SOTC may be connected to a package sorting unit SOT2, which sorts the good individual packages INP_G based on test bin item information, and mounts the sorted good individual packages INP_G on the test tray 220.

Furthermore, after the good individual packages INP_G is mounted on the test tray 220 based on test bin item information, a lot number may be assigned to the good individual packages INP_G mounted on the test tray 220 based on test bin items by using a lot number assigning unit SOT3 included in the sorter control unit SOTC of the package sorter 94.

When the individual package INP picked up by the picker 212 is a bad package INP_B, the stage driver 252 may move the stage 250 such that the container 230 is located under the moving path of the picker 212 as shown in FIG. 19. The stage driver 252 may adjust positions of the containers 230 and 232 and the second inspection module 240 based on a result of the inspection of the individual packages INP. Thus, when the individual package INP picked up by the picker 212 is the bad package INP_B, the bad package INP_B may not be inspected by the second inspection module 240 but contained in the container 230.

While the inventive concept has been particularly shown and described with reference to embodiments thereof, it will be understood that various changes in form and details may be made therein without departing from the spirit and scope of the following claims.

What is claimed is:

1. A method of manufacturing a semiconductor package, the method comprising:

obtaining a plurality of individual chips classified according to a test bin item as a result of performing an electrical die sorting (EDS) process including testing electrical characteristics of a plurality of chips at a wafer level;

packaging the plurality of individual chips on corresponding chip mounting regions of a circuit substrate and forming a plurality of individual packages based on position information of the chip mounting regions, each of the plurality of individual packages having test bin item information corresponding to the test bin item;

classifying the plurality of individual packages according to the test bin item based on the test bin item information; and testing the plurality of individual packages classified according to the test bin item.

2. The method of claim 1, wherein the obtaining of the plurality of individual chips classified according to the test bin item comprises:

manufacturing the plurality of chips on a wafer; and after performing the EDS process, sawing the wafer and obtaining the plurality of individual chips classified according to the test bin item.

3. The method of claim 1, wherein the test bin item used in the EDS process includes at least one of voltage I/O characteristics, current I/O characteristics, leakage characteristics, functional characteristics, and timing characteristics of the plurality of individual chips.

4. The method of claim 1, wherein the forming of the plurality of individual packages comprises:

attaching the plurality of individual chips to a plurality of chip mounting regions of the circuit substrate, respectively;

forming a strip package including a molding layer obtained by molding the plurality of individual chips;

marking the test bin item information on a surface of the molding layer of the plurality of individual chips based on position information of the plurality of chip mounting regions; and sawing the strip package by the plurality of individual chips.

5. The method of claim 4, wherein the classifying of the plurality of individual packages according to the test bin item comprises:

recognizing the test bin item information marked on the surface of the molding layer of the plurality of individual chips;

sorting the plurality of individual packages according to the test bin item based on the recognized test bin item information and mounting the plurality of sorted individual packages on a test tray; and assigning a lot number to the plurality of individual packages mounted on the test tray according to the test bin item.

6. The method of claim 1, wherein the position information of the chip mounting regions is information about X and Y coordinates of the circuit substrate.

7. The method of claim 1, wherein the forming of the plurality of individual packages comprises:

stacking and attaching respective two or more individual chips of the plurality of individual chips on and to a plurality of chip mounting regions of the circuit substrate, respectively, according to the test bin item;

forming a strip package including a molding layer obtained by molding the respective two or more individual chips;

marking the test bin item information on a surface of the molding layer of the respective two or more individual chips based on position information of the chip mounting regions; and sawing the strip package by the two or more stacked individual chips.

8. The method of claim 7, wherein the classifying of the plurality of individual packages according to the test bin item comprises:

recognizing the test bin item information marked on the surface of the molding layer of the two or more stacked individual chips;

sorting the plurality of individual packages according to the test bin item based on the recognized test bin item information and mounting the plurality of sorted individual packages on a test tray; and assigning a lot number to the plurality of individual packages mounted on the test tray according to the test bin item.

9. The method of claim 1, wherein the testing of the plurality of classified individual packages includes testing for electrical characteristics other than for the test bin item.

10. A method of manufacturing a semiconductor package, the method comprising:

performing an electrical die sorting (EDS) process for testing electrical characteristics of a plurality of chips on a wafer level;

sawing a wafer to obtain a plurality of individual chips, which are classified according to a test bin item through the EDS process;

attaching the plurality of individual chips to a plurality of chip mounting regions of a circuit substrate, respectively;

forming a strip package including a molding layer obtained by molding the plurality of individual chips attached to the circuit substrate;

marking test bin item information corresponding to the test bin item on a surface of the molding layer of the plurality of individual chips based on position information of the plurality of chip mounting regions;

sawing the strip package by the plurality of individual chips and forming a plurality of individual packages;

classifying the plurality of individual packages according to the test bin item by using the test bin item information; and testing the plurality of individual packages classified according to the test bin item.

11. The method of claim 10, wherein the test bin item of the EDS process is at least one of voltage I/O characteristics, current I/O characteristics, leakage characteristics, functional characteristics, and timing characteristics of the plurality of individual chips.

12. The method of claim 10, wherein the testing of the plurality of classified individual packages includes testing for electrical characteristics other than for the test bin item.

13. The method of claim 10, wherein the attaching of the plurality of individual chips to the plurality of chip mounting regions of the circuit substrate, respectively, comprises attaching and stacking respective two or more individual chips of the plurality of individual chips to and on the plurality of chip mounting regions of the circuit substrate, respectively, based on the test bin item.

14. The method of claim 10, wherein the classifying of the plurality of individual packages according to the test bin item comprises:

recognizing the test bin item information marked on the surface of the molding layer of the plurality of individual chips; and sorting the plurality of individual packages according to the test bin item based on the recognized test bin item information and mounting the plurality of sorted individual packages on a test tray.

15. The method of claim 14, further comprising, after the mounting of the plurality of sorted individual packages on the test tray, assigning a lot number to the plurality of individual packages mounted on the test tray.

16. The method of claim 10, wherein position information of the plurality of chip mounting regions is information about X and Y of the circuit substrate.

17. A method of manufacturing a semiconductor package, the method comprising:

testing electrical characteristics of a plurality of chips on a wafer level by using a wafer tester and obtaining a plurality of individual chips, which are classified according to a test bin item;

attaching the plurality of individual chips to a plurality of chip mounting regions of a circuit substrate, respectively by using a chip attacher;

forming a strip package including a molding layer obtained by molding the plurality of individual chips on the circuit substrate with a molder;

marking test bin item information corresponding to the test bin item on a surface of the molding layer of each of the plurality of individual chips with a marker based on position information of the plurality of chip mounting regions;

sawing the strip package by the plurality of individual chips by using a package sorter and forming a plurality of individual packages;

classifying the plurality of individual packages according to the test bin item by using the package sorter and mounting the plurality of classified individual packages on a test tray; and testing the plurality of individual packages, which are classified according to the test bin item, by using a package tester.

18. The method of claim 17, wherein the classifying of the plurality of individual packages according to the test bin item and the mounting of the plurality of classified individual packages on the test tray comprise:

recognizing the test bin item information, which is marked on the surface of the molding layer of the plurality of individual chips, by using a marking recognition circuit included in a sorter control unit of the package sorter; and sorting the plurality of individual packages according to the test bin item by using a package sorting circuit included in the sorter control unit of the package sorter and mounting the plurality of sorted individual packages on the test tray.

19. The method of claim 18, further comprising:

after the mounting of the plurality of sorted individual packages on the test tray, assigning a lot number to the plurality of individual packages mounted on the test tray based on the test bin item by using a lot number assigning circuit included in the sorter control unit of the package sorter.

20. The method of claim 17, wherein the testing of the plurality, of classified individual packages includes testing for electrical characteristics other than for the test bin item.

* * * * *